United States Patent
Sugimoto et al.

(10) Patent No.: US 9,082,815 B2
(45) Date of Patent: Jul. 14, 2015

(54) SEMICONDUCTOR DEVICE HAVING CARRIER EXTRACTION IN ELECTRIC FIELD ALLEVIATING LAYER

(71) Applicants: Masahiro Sugimoto, Toyota (JP); Yuichi Takeuchi, Obu (JP)

(72) Inventors: Masahiro Sugimoto, Toyota (JP); Yuichi Takeuchi, Obu (JP)

(73) Assignees: TOYOTA JIDOSHA KABUSHIKI KAISHA, Toyota-shi (JP); DENSO CORPORATION, Kariya-shi (JP)

( * ) Notice: Subject to any disclaimer, the term of this patent is extended or adjusted under 35 U.S.C. 154(b) by 0 days.

(21) Appl. No.: 14/244,038

(22) Filed: Apr. 3, 2014

(65) Prior Publication Data

US 2014/0319577 A1    Oct. 30, 2014

(30) Foreign Application Priority Data

Apr. 24, 2013 (JP) ................... 2013-091198

(51) Int. Cl.
| | |
|---|---|
| H01L 29/739 | (2006.01) |
| H01L 29/66 | (2006.01) |
| H01L 29/36 | (2006.01) |
| H01L 29/423 | (2006.01) |
| H01L 29/10 | (2006.01) |
| H01L 29/778 | (2006.01) |
| H01L 29/16 | (2006.01) |
| H01L 29/20 | (2006.01) |

(52) U.S. Cl.
CPC ........ *H01L 29/7397* (2013.01); *H01L 29/1095* (2013.01); *H01L 29/1608* (2013.01); *H01L 29/2003* (2013.01); *H01L 29/36* (2013.01); *H01L 29/4236* (2013.01); *H01L 29/66348* (2013.01); *H01L 29/7789* (2013.01)

(58) Field of Classification Search
CPC ................. H01L 29/7397; H01L 29/66348
USPC .................. 257/330, 332, 334, E29.26
See application file for complete search history.

(56) References Cited

U.S. PATENT DOCUMENTS

| | | | | |
|---|---|---|---|---|
| 5,963,807 | A * | 10/1999 | Ueno ............................. | 438/268 |
| 6,982,459 | B2 * | 1/2006 | Suzuki et al. ................. | 257/329 |
| 7,033,892 | B2 * | 4/2006 | Hsu et al. ...................... | 438/270 |
| 7,420,246 | B2 * | 9/2008 | Ozoe et al. .................... | 257/330 |
| 7,541,643 | B2 * | 6/2009 | Ono et al. ...................... | 257/341 |
| 7,825,449 | B2 * | 11/2010 | Suzuki et al. ................. | 257/301 |
| 7,851,854 | B2 * | 12/2010 | Okuno et al. ................. | 257/330 |
| 7,947,555 | B2 * | 5/2011 | Akiba et al. ................... | 438/270 |

(Continued)

FOREIGN PATENT DOCUMENTS

| | | |
|---|---|---|
| JP | 11-195788 | 7/1999 |
| JP | 2009-117593 | 5/2009 |

*Primary Examiner* — Ida M Soward
(74) *Attorney, Agent, or Firm* — Oblon, McClelland, Maier & Neustadt, L.L.P.

(57) ABSTRACT

A semiconductor device disclosed in this specification includes a p+ contact region, an n+ source region, a p− base region, an n− drift region, a gate electrode, an insulator, a p+ electric field alleviating layer, and a p− positive hole extraction region. The electric field alleviating layer has same impurity concentration as the base region or higher, contacts a lower surface of the base region, and is formed in a same depth as the gate trench or in a position deeper than the gate trench. A positive hole extraction region extends to contact the electric field alleviating layer from a position to contact an upper surface of a semiconductor substrate or a first semiconductor region, and extracts a positive hole that is produced in the electric field alleviating layer at the avalanche breakdown to the upper surface of the semiconductor substrate.

3 Claims, 3 Drawing Sheets

(56) References Cited

U.S. PATENT DOCUMENTS

| | | | |
|---|---|---|---|
| 8,193,564 B2* | 6/2012 | Suzuki et al. | 257/216 |
| 8,390,060 B2* | 3/2013 | Darwish et al. | 257/330 |
| 8,461,648 B2* | 6/2013 | Pfirsch et al. | 257/341 |
| 8,482,061 B2* | 7/2013 | Nishimura | 257/330 |
| 8,643,055 B2* | 2/2014 | Ankoudinov et al. | 257/124 |
| 8,748,975 B2* | 6/2014 | Fujiwara et al. | 257/330 |
| 2008/0012026 A1* | 1/2008 | Tsuji | 257/77 |
| 2009/0114969 A1 | 5/2009 | Suzuki et al. | |
| 2012/0146133 A1* | 6/2012 | Hirler et al. | 257/330 |
| 2013/0306983 A1* | 11/2013 | Nakano et al. | 257/76 |
| 2014/0097517 A1* | 4/2014 | Moens et al. | 257/607 |
| 2014/0145212 A1* | 5/2014 | Takeuchi et al. | 257/77 |
| 2014/0175459 A1* | 6/2014 | Yamamoto et al. | 257/77 |

* cited by examiner

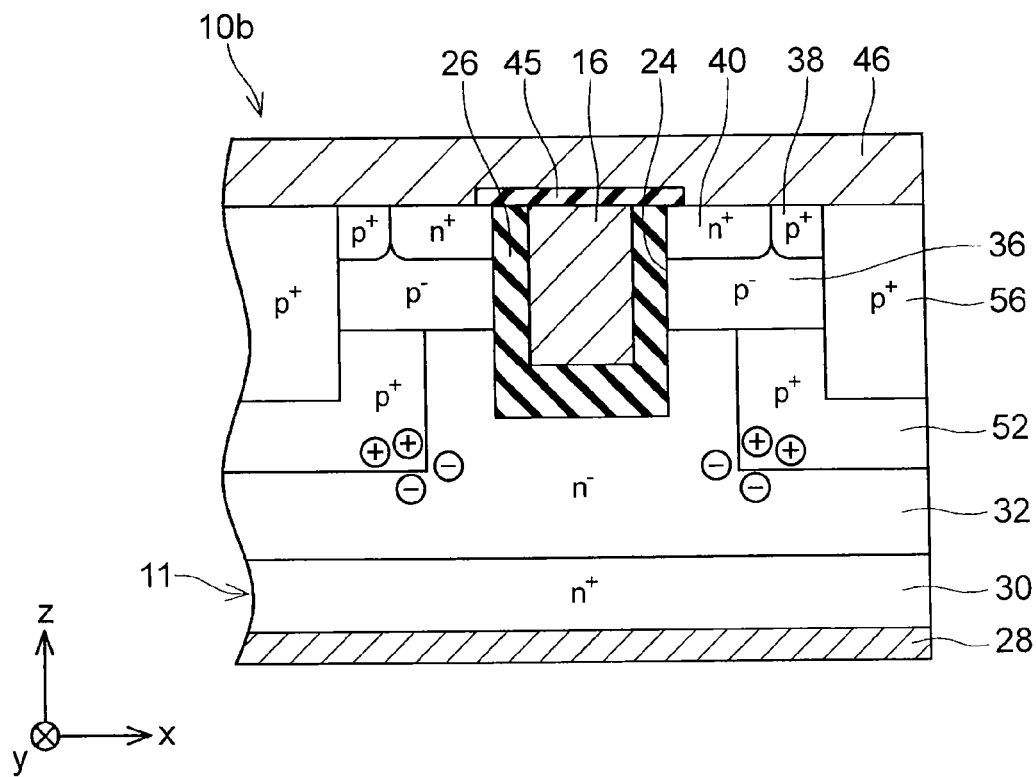
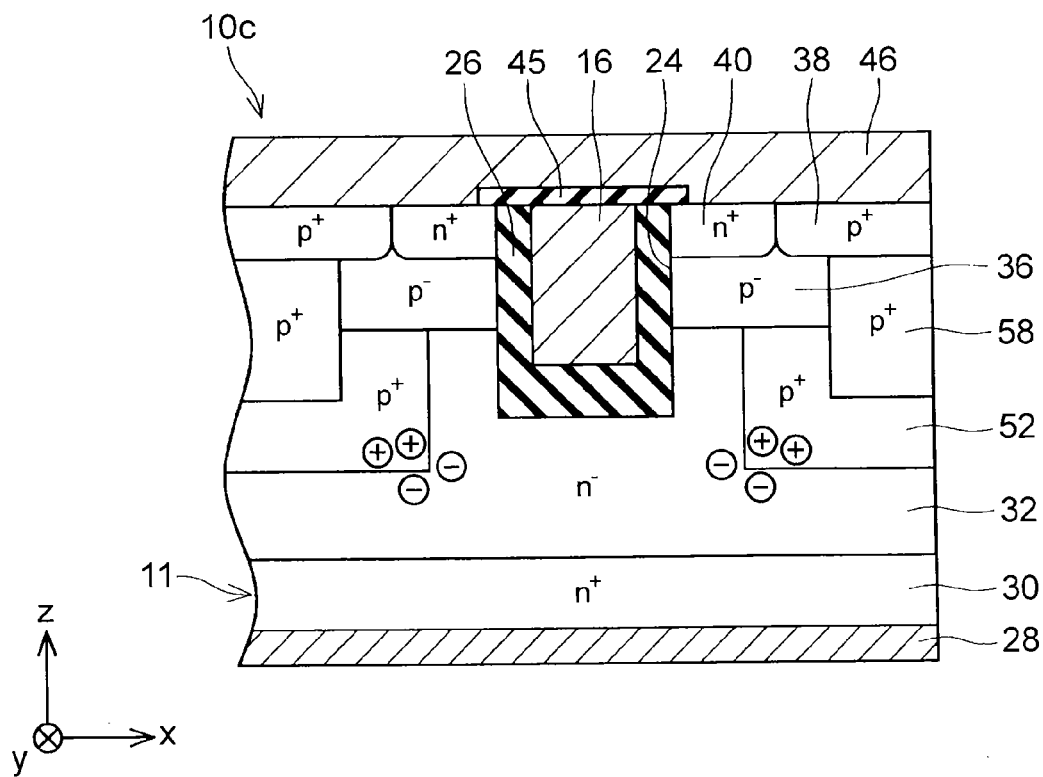

SEMICONDUCTOR DEVICE HAVING CARRIER EXTRACTION IN ELECTRIC FIELD ALLEVIATING LAYER

INCORPORATION BY REFERENCE

The disclosure of Japanese Patent Application No. 2013-091198 filed on Apr. 24, 2013 including the specification, drawings and abstract is incorporated herein by reference in its entirety.

BACKGROUND OF THE INVENTION

1. Field of the Invention

A technique disclosed in this specification relates to a semiconductor device.

2. Description of Related Art

Japanese Patent Application Publication No. 2009-117593 (JP 2009-117593 A) discloses a SiC semiconductor device of trench gate type. This semiconductor device is formed with an n-type drift layer on a SiC substrate and a trench that extends from an upper surface of the SiC substrate to the drift layer. On the drift layer, a p-type base region is formed to contact a side surface of the trench. P-type deep layers are formed to interpose the base region therebetween and to separate from the trench. The deep layer is formed in a same depth as the trench or to a position deeper than the trench, and is doped at same concentration as the base region or higher. According to the technique disclosed in JP 2009-117593 A, when a reverse bias voltage is applied to the semiconductor device, a depletion layer that extends from a p-n junction between the p-type deep layer and the n-type drift layer greatly extends to the drift layer side. This can alleviate intensity of an electric field in a gate oxide film formed in the trench and thus can prevent breakage of the gate oxide film.

In recent years, researches and developments of high-voltage semiconductor devices using a SiC have actively been pursued. Compared with Si semiconductor devices, a thickness of the drift layer in the SiC semiconductor devices with the same withstand voltage can be thinned. The SiC increases a withstand voltage of the semiconductor device; however, because the electric field that is applied to the gate oxide film is also strengthened, there is a need for further alleviating the electric field that is applied to the gate oxide film. In order to form an electric field alleviating layer in the further vicinity of the gate oxide film for this purpose, it is considered to form a semiconductor region that contacts a lower face of the base region and is doped at the same concentration as the base region or higher. When such a semiconductor region is formed from the lower surface of the base region to a position in the same depth as the trench or deeper, the electric field applied to the gate oxide film is further alleviated, and thus a withstand voltage property of the semiconductor device can be enhanced (the semiconductor region is hereafter referred to as the "electric field alleviating layer").

However, in the above-described semiconductor device that includes the electric field alleviating layer, if the excess reverse bias voltage is temporarily applied, the avalanche breakdown may occur at an interface between the electric field alleviating layer and the drift layer. When the avalanche breakdown occurs, an electron-positive hole pair is produced at the interface, and the thus-produced positive hole moves to the base region. In general, the positive hole that has moved to the base region is discharged from a p-type contact region to a source electrode. However, due to low impurity concentration, the base region has high resistance. Accordingly, a transfer rate of the positive hole is low in the base region, and the positive holes are likely to be accumulated in the base region. Therefore, the positive hole that is produced at the avalanche breakdown cannot be discharged from the contact region in a timely manner. As a result, a potential of the base region rises, and a parasitic npn bipolar transistor that is formed of an n-type source region formed above the base region, the p-type base region, and the n-type drift layer is operated to possibly cause a flow of overcurrent between the source region and a drain due to a latchup.

SUMMARY OF THE INVENTION

This specification provides a technique for efficiently discharging a positive hole that is produced at avalanche breakdown in a semiconductor device that includes an electric field alleviating layer under a base region.

In a semiconductor device disclosed in this specification includes a first semiconductor region, a second semiconductor region, a base region, a drift region, a gate electrode, an insulator, an electric field alleviating layer, and a carrier extraction region. The first semiconductor region is of a first conductive type and is disposed in an area facing an upper surface of a semiconductor substrate. The second semiconductor region is of a second conductive type and is disposed in the area facing the upper surface of the semiconductor substrate. The base region is of the first conductive type and contacts a lower surface of the first semiconductor region and a lower surface of the second semiconductor region. The drift region is of the second conductive type, contacts a lower surface of the base region, and is separated from the first semiconductor region and the second semiconductor region by the base region. The gate electrode is disposed in a gate trench that penetrates the base region and extends to the drift region, and faces the base region in an area that separates the second semiconductor region from the drift region. The insulator is disposed between the gate electrode and an inner wall of the gate trench. The electric field alleviating layer is of the first conductive type, the electric field alleviating layer of the first conductive type has same impurity concentration as the base region of the first conductive type or higher, the electric field alleviating layer contacts the lower surface of the base region, and the electric field alleviating layer is formed in a same depth as the gate trench or in a position deeper than the gate trench. A carrier extraction region is of the first conductive type, extends to contact the electric field alleviating layer from a position to contact the upper surface of the semiconductor substrate or the first semiconductor region, and extracts a carrier that is produced in the electric field alleviating layer at avalanche breakdown to the upper surface of the semiconductor substrate.

In the above semiconductor device, the carrier extraction region is formed to contact the electric field alleviating layer from the position to contact the upper surface of the semiconductor substrate or the first semiconductor region. Accordingly, when an excess reverse bias voltage is temporarily applied to the semiconductor device, and when the avalanche breakdown occurs at an interface between the electric field alleviating layer and the drift layer, the carrier that is produced at the above interface due to the occurrence of the avalanche breakdown is rapidly extracted to the upper surface of the semiconductor substrate by the carrier extraction region. In other words, the carrier that is produced due to the occurrence of the avalanche breakdown is less likely to flow into the base region. Therefore, it is possible to suppress an operation of the parasitic bipolar transistor and thus is possible to suppress overcurrent from flowing through the semiconductor device.

Details of the technique that is disclosed in this specification and further improvements thereof will be described in DETAILED DESCRIPTION OF EMBODIMENTS and for each embodiment.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 5 is a vertical cross-sectional view of the semiconductor device according to a third embodiment; and FIG. 6 is a vertical cross-sectional view of the semiconductor device in a modified example 1.

DETAILED DESCRIPTION OF EMBODIMENTS

Primary features of embodiments, which will be described below, will be listed here. It should be noted that technical elements described below are independent of each other, demonstrate technical utility when used singly or in various combinations, and thus are not limited to the combinations described in the claims in the original application.

(Feature 1) A semiconductor device disclosed in this specification may be configured such that a carrier extraction region is formed of a material having a different band gap from a material used for a base region. A junction interface between the carrier extraction region and the base region may be formed with a two-dimensional carrier gas layer that has smaller transfer resistance of a carrier than the base region. According to the feature 1, the carrier extraction region and the base region form a heterojunction, and the two-dimensional carrier gas layer is formed at the junction interface. In this configuration, the carrier that is produced in the electric field alleviating layer by avalanche breakdown travels through the two-dimensional carrier gas layer having the smaller transfer resistance than the base region, and is extracted to an upper surface of a semiconductor substrate. This suppresses an operation of the parasitic bipolar transistor and thus can suppress overcurrent from flowing through the semiconductor device.

(Feature 2) In the semiconductor device disclosed in this specification, impurity concentration of the carrier extraction region of the first conductive type may be higher than the impurity concentration of the base region of the first conductive type. According to the feature 2, the carrier extraction region has the smaller resistance than the base region. In this configuration, the carrier that is produced in the electric field alleviating layer by the avalanche breakdown preferentially flows into the carrier extraction region and is extracted to the upper surface of the semiconductor substrate. Accordingly, the carrier is less likely to flow into the base region, and it is thereby possible to suppress the overcurrent from flowing through the semiconductor device.

Figure 1:
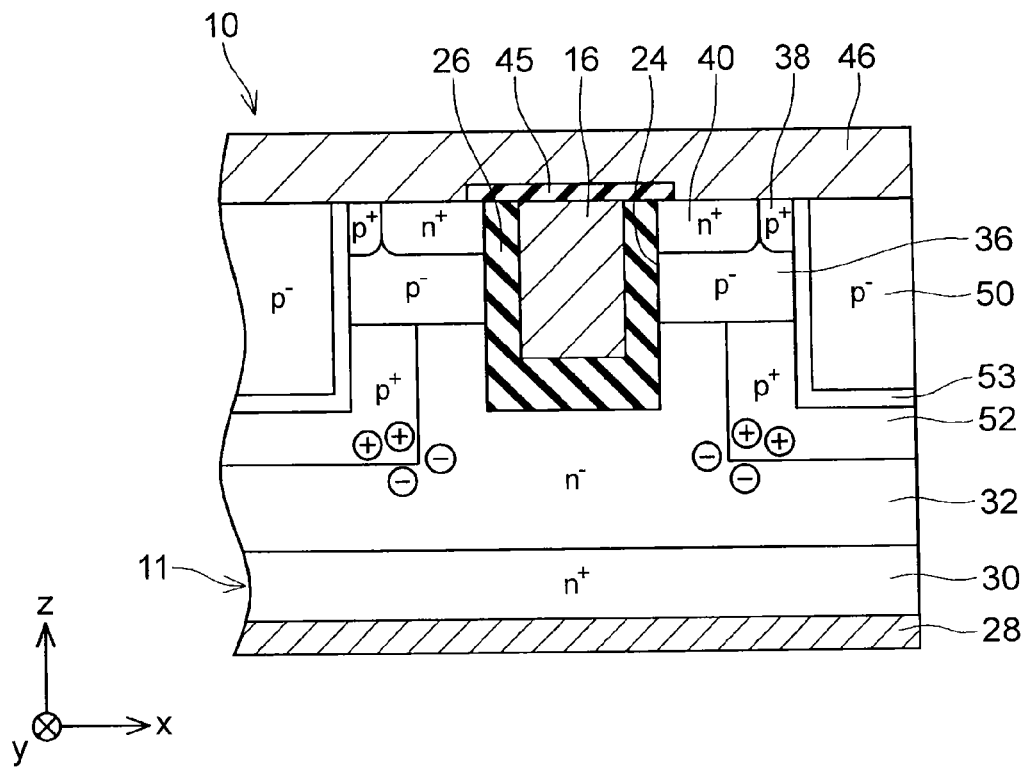
FIG. 1 is a vertical cross-sectional view of a semiconductor device according to a first embodiment.

A description will be made on a semiconductor device 10 of this embodiment. As shown in FIG. 1, the semiconductor device 10 includes a semiconductor substrate 11. The semiconductor substrate 11 is formed with an element region and a non-element region that surrounds the element region. The element region will hereinafter be described. However, the non-element region will not be described because it adopts a configuration of related art. In this embodiment, a SiC substrate is used for the semiconductor substrate 11; however, a substrate is not limited thereto, and a substrate formed of another material (such as a Si substrate) may be used.

A configuration of the element region will be described with reference to FIG. 1. The element region of the semiconductor substrate 11 is formed with an insulation gate semiconductor element. More specifically, the element region is formed with an n+ source region 40 and a p+ contact region 38 in a region that faces an upper surface of the semiconductor substrate 11. The contact region 38 is formed to contact the source region 40. The p+ contact region 38 corresponds to an example of "the first semiconductor region of the first conductive type" while the n+ source region 40 corresponds to an example of "the second semiconductor region of the second conductive type".

A p− base region 36 is formed on a lower side of the source region 40 and the contact region 38. The impurity concentration of the base region 36 is set to be lower than the impurity concentration of the contact region 38. The base region 36 contacts the source region 40 and the contact region 38. Thus, the source region 40 is surrounded by the base region 36 and the contact region 38.

A p+ electric field alleviating layer 52 is formed on a lower side of the base region 36. The impurity concentration of the electric field alleviating layer 52 is set to be higher than the impurity concentration of the base region 36. The electric field alleviating layer 52 contacts a part of a lower surface of the base region 36 and is separated from a gate trench 24, which will be described below. The electric field alleviating layer 52 is formed deeper than the gate trench 24. The electric field alleviating layer 52 is formed to extend below a positive hole extraction region 50, which will be described below, and contacts a lower surface of the positive hole extraction region 50. The electric field alleviating layer 52 is separated from the source region 40 and the contact region 38 by the base region 36.

The p− positive hole extraction region 50 is formed in a region that faces the upper surface of the semiconductor substrate 11. The positive hole extraction region 50 penetrates the contact region 38 and the base region 36, and a lower end thereof extends to the electric field alleviating layer 52. In this embodiment, the positive hole extraction region 50 is formed of AlN. The impurity concentration of the positive hole extraction region 50 is set to be lower than the impurity concentration of the base region 36. A junction interface between the positive hole extraction region 50 and the base region 36 is formed with a two-dimensional positive hole gas layer 53. The two-dimensional positive hole gas layer 53 is also formed at a junction interface between the positive hole extraction region 50 and the electric field alleviating layer 52 and at a junction interface between the positive hole extraction region 50 and the contact region 38. The two-dimensional positive hole gas layer 53 will be described later. The positive hole extraction region 50 corresponds to an example of the "carrier extraction region", and the two-dimensional positive hole gas layer 53 corresponds to an example of the "two-dimensional carrier gas layer".

An n− drift region 32 is further formed on the lower side of the base region 36. The drift region 32 is formed over an entire surface of the semiconductor substrate 11. The drift region 32 contacts a part of the lower surface of the base region 36 (more specifically, a part of the lower surface of the base region 36 that does not contact the electric field alleviating layer 52) as well as a side surface and a lower surface of the electric field alleviating layer 52. In other words, the drift region 32 is formed to surround the electric field alleviating layer 52. The drift region 32 is separated from the positive hole extraction region 50 by the electric field alleviating layer 52. In addition, the drift region 32 is separated from the source region 40 and the contact region 38 by the base region 36.

The semiconductor substrate 11 is formed with the gate trench 24. The gate trench 24 penetrates the source region 40 and the base region 36 from the upper surface of the semiconductor substrate 11, and a lower end thereof extends to the drift region 32. The gate trench 24 is separated from the electric field alleviating layer 52, and the drift region 32 is disposed between the electric field alleviating layer 52 and the gate trench 24. The gate trench 24 is formed with a gate electrode 16 therein. The gate electrode 16 is formed such that a lower end thereof is positioned slightly deeper than the lower surface of the base region 36. A space between a wall surface of the gate trench 24 and the gate electrode 16 (that is, on a side of and below the gate electrode 16) is filled with the insulator 26. Accordingly, the gate electrode 16 faces the base region 36 and the source region 40 via the insulator 26. A cap insulation film 45 is formed on an upper surface of the gate electrode 16.

An n+ drain region 30 is formed in an area that faces a lower surface of the semiconductor substrate 11. The drain region 30 is formed over the entire surface of the semiconductor substrate 11. The impurity concentration of the drain region 30 is set to be higher than the impurity concentration of the drift region 32. The drain region 30 contacts a lower surface of the drift region 32. The drain region 30 is separated from the base region 36 and the electric field alleviating layer 52 by the drift region 32.

A drain electrode 28 is formed on the lower surface of the semiconductor substrate 11. The drain electrode 28 is formed over the entire surface of the semiconductor substrate 11. The drain electrode 28 is in ohmic contact with the drain region 30. A source electrode 46 is formed on the upper surface of the semiconductor substrate 11. The source electrode 46 is formed in the element region. The source electrode 46 is in ohmic contact with the source region 40, the contact region 38, and the positive hole extraction region 50. The source electrode 46 is insulated from the gate electrode 16 by the cap insulation film 45.

Figure 2:
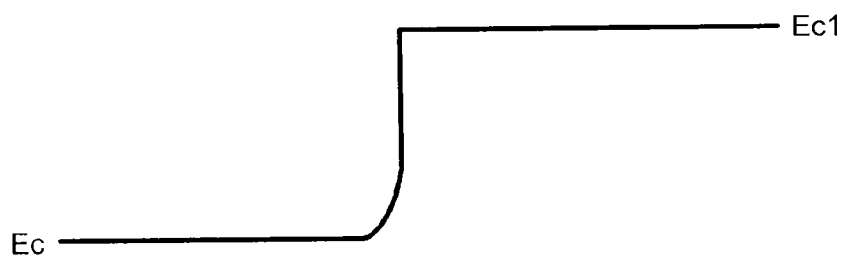
FIG. 2 is an energy band diagram of a SiC/AlN heterojunction in the semiconductor device of the first embodiment.
Figure 2:
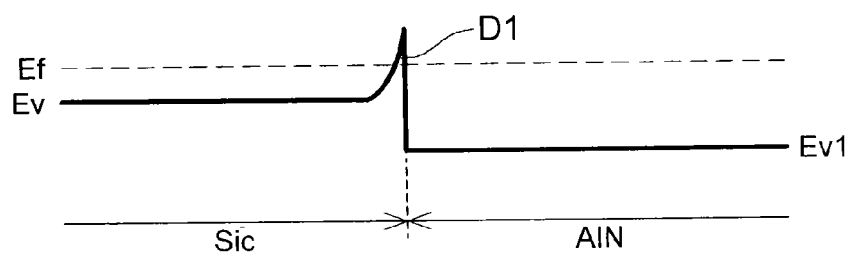

Next, a description will be made on the two-dimensional positive hole gas layer 53 that is formed at the junction interface between the base region 36 and the positive hole extraction region 50. FIG. 2 is an energy band diagram of the junction interface between the base region 36 and the positive hole extraction region 50. The base region 36 is formed of SiC, and the positive hole extraction region 50 is formed of AlN. Ec represents a minimum value in an energy level of a SiC conduction band, and Ev represents a maximum value in an energy level of a SiC valence band. Meanwhile, Ec1 represents a minimum value in an energy level of an AlN conduction band, and Ev1 represents a maximum value in an energy level of an AlN valence band. Ef represents a Fermi level. A band gap of SiC (that is, Ec-Ev) is approximately 3.3 eV, and a band gap of AlN (that is, Ec1-Ev1) is approximately 6.2 eV. In other words, the positive hole extraction region 50 is formed of a material having the larger band gap than a material used for the base region 36. Due to this difference in the band gap, a SiC/AlN heterojunction interface has a valence band offset.

Due to the band offset, a region D1 in which the valence band exceeds the Fermi level is formed on the SiC side at the junction interface. The region D1 has the positive holes accumulated therein and thus has the substantially higher concentration of the positive holes than the base region 36 and the positive hole extraction region 50. In other words, the transfer resistance of the positive hole in the region D1 is much smaller than the transfer resistance of the positive hole in the base region 36 and the positive hole extraction region 50. Accordingly, the positive hole can flow through the region D1 at an extremely fast rate. The positive hole is produced when an impurity that is introduced into the semiconductor region is ionized. Thus, it should be noted that a magnitude relationship of the positive hole concentration among the semiconductor regions correspond to a magnitude relationship of the impurity concentration among the semiconductor regions in this specification. The region D1 is an extremely thin layer region that is formed two-dimensionally along the junction interface between the base region 36 and the positive hole extraction region 50, and the positive hole moves within the region D1 along the junction interface. Thus, in this embodiment, the region D1 is referred to as the "two-dimensional positive hole gas layer 53". As shown in FIG. 1, the two-dimensional positive hole gas layer 53 is formed on the base region 36 side at the junction interface between the base region 36 and the positive hole extraction region 50.

The electric field alleviating layer 52 and the contact region 38 are also formed of SiC, that is, the same material used for the base region 36. Accordingly, in this embodiment, the two-dimensional positive hole gas layer is formed at a junction interface between the positive hole extraction region 50 and each of these (the electric field alleviating layer 52 and the contact region 38) by adjusting the impurity concentration of the electric field alleviating layer 52, that of the contact region 38, and the like. Because these two-dimensional positive hole gas layers have a substantially same configuration as the two-dimensional positive hole gas layer 53 that is formed at the junction interface between the base region 36 and the positive hole extraction region 50, a detailed description thereof will not be made. These two-dimensional positive hole gas layers are each formed on the electric field alleviating layer 52 side and on the contact region 38 side in the junction interface in a similar manner as the two-dimensional positive hole gas layer 53. In addition, the positive hole concentration of the two-dimensional positive hole gas layer is substantially higher than the positive hole concentration of the electric field alleviating layer 52 and the positive hole concentration of the contact region 38. In other words, the transfer resistance of the positive hole in the two-dimensional positive hole gas layer is much smaller than the transfer resistance of the positive hole in each of the electric field alleviating layer 52 and the contact region 38. For this reason, the two-dimensional positive hole gas layer formed at the junction interface between the electric field alleviating layer 52 and the positive hole extraction region 50 and the two-dimensional positive hole gas layer formed at the junction interface between the contact region 38 and the positive hole extraction region 50 will also hereinafter be referred to as the two-dimensional positive hole gas layer 53. In other words, the two-dimensional positive hole gas layer 53 is formed on the base region 36 side in the lower surface and the side surface of the positive hole extraction region 50 so as to extend to the upper surface of the semiconductor substrate 11.

When the above-described semiconductor device 10 is used, the drain electrode 28 is connected to a power supply potential, and the source electrode 46 is connected to a ground potential. If the potential that is applied to a gate pad (not shown) is lower than threshold potential, the semiconductor device 10 remains off. When the semiconductor device 10 is off, a depletion layer expands by a p-n junction at an interface between the base region 36 and the drift region 32 and by a p-n junction at an interface between the electric field alleviating layer 52 and the drift region 32. Because the depletion layer expands by the p-n junction between the electric field alleviating layer 52 and the drift region 32, an electric field that is applied to the insulator 26 is alleviated, and a withstand voltage property of the semiconductor device 10 is thereby enhanced.

When the potential that is applied to the gate pad becomes equal to or larger than the threshold potential, the semiconductor device 10 is turned on. In other words, in the element region, the potential that is applied to the gate pad is applied to the gate electrode 16 through a gate wiring, which is not shown. When the potential that is applied to the gate electrode 16 becomes equal to or larger than the threshold potential, a channel is formed in an area of the base region 36 that contacts the insulator 26. Accordingly, electrons travel from the source electrode 46 to the drain electrode 28 through the source region 40, the channel in the base region 36, the drift region 32, and the drain region 30. That is, current flows from the drain electrode 28 to the source electrode 46.

Here, if an excess reverse bias voltage is temporarily applied to the semiconductor device 10, avalanche breakdown may occur at the interface between the electric field alleviating layer 52 and the drift region 32. When the avalanche breakdown occurs, an electron-positive hole pair is produced at the above interface as shown in FIG. 1. The produced positive hole travels through the two-dimensional positive hole gas layer 53 in which the transfer resistance of the positive hole is much smaller than that in the peripheral semiconductor regions, rapidly travels through the two-dimensional positive hole gas layer 53, and is discharged to the source electrode 46.

In the semiconductor device 10 of the first embodiment, the positive hole extraction region 50 that extends from the upper surface of the semiconductor substrate to the electric field alleviating layer 52 is formed by using the material (AlN) having the larger band gap than the material (SiC) used for the semiconductor substrate. Accordingly, the valence band offset is formed in the SiC/AlN junction interface, and the region D1 (that is, the two-dimensional positive hole gas layer 53) that facilitates accumulation of the positive holes is formed in the junction interface. Because the positive hole concentration of the two-dimensional positive hole gas layer 53 is substantially larger than that of the peripheral semiconductor regions, the transfer resistance of the positive hole therein is remarkably reduced, and the positive holes can thereby travel at the extremely fast rate. The two-dimensional positive hole gas layer 53 is formed just as described. Thus, the positive hole that is produced in a boundary with the electric field alleviating layer 52 at the avalanche breakdown preferentially flows into the two-dimensional positive hole gas layer 53 that contacts the electric field alleviating layer 52, and is efficiently discharged to the source electrode 46. Accordingly, the positive hole is less likely to flow into the base region 36, and the potential increase in the base region 36 is thereby suppressed. As a result, the operation of the parasitic bipolar transistor can be suppressed. Therefore, it is possible to suppress the overcurrent from flowing through the semiconductor device 10.

Figure 3:
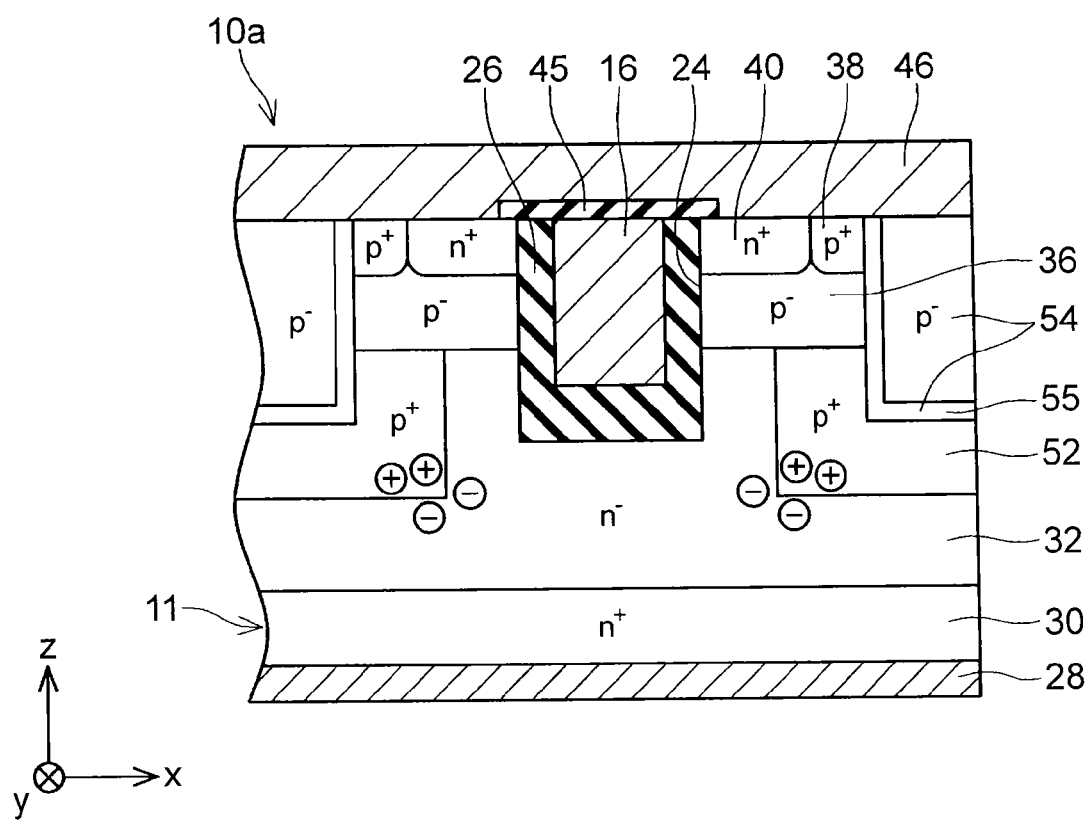
FIG. 3 is a vertical cross-sectional view of the semiconductor device according to a second embodiment.
Figure 4:
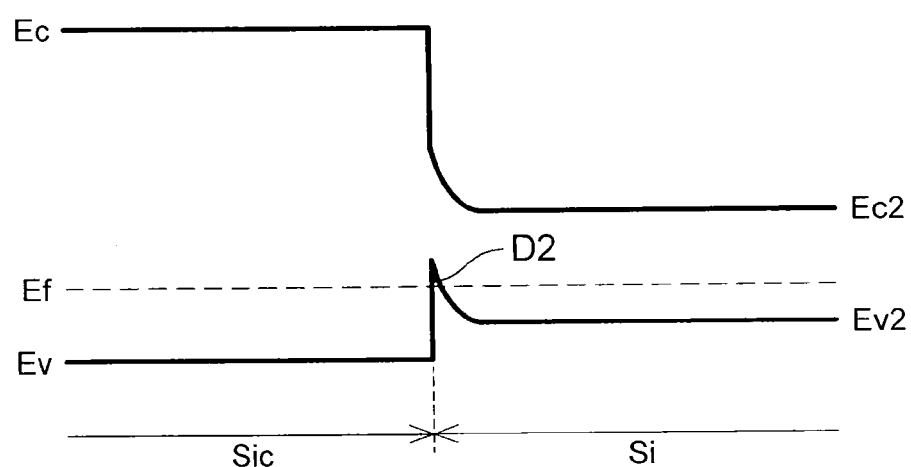
FIG. 4 is an energy band diagram of a SiC/Si heterojunction in the semiconductor device of the second embodiment.

Next, a description will be described on a second embodiment with reference to FIGS. 3, 4. A following description will only made on different points from the first embodiment, and a description on a same configuration as that of the first embodiment will not be repeated.

A semiconductor device 10a of the second embodiment differs from the first embodiment in a point that a positive hole extraction region 54 is formed of Si. FIG. 4 is the energy band diagram at a junction interface between the base region 36 and the positive hole extraction region 54. The base region 36 is formed of SiC, and the positive hole extraction region 54 is formed of Si. Ec2 represents a minimum value in the energy level of a Si conduction band, and Ev2 represents a maximum value in the energy level of a Si valence band. The band gap of Si (that is, Ec2-Ev2) is approximately 1.1 eV. That is, the positive hole extraction region 54 is formed of a material having a smaller band gap than the material used for the base region 36. Due to the difference in the band gap, a SiC/Si heterojunction interface has the valence band offset.

Due to the band offset, a region D2 in which the valence band exceeds the Fermi level is formed on the Si side at the junction interface. Similar to the region D1, positive hole concentration of the region D2 is substantially larger than that of the base region 36 and the positive hole extraction region 54, and the transfer resistance of the positive hole in the region D2 is much smaller than that in the base region 36 and the positive hole extraction region 54. Accordingly, the positive hole can flow at the extremely fast rate in the region D2. In this embodiment, the region D2 is referred to as a "two-dimensional positive hole gas layer 55". As shown in FIG. 3, the two-dimensional positive hole gas layer 55 is formed on the positive hole extraction region 54 side at the junction interface between the base region 36 and the positive hole extraction region 54.

The electric field alleviating layer 52 and the contact region 38 are also formed of SiC, that is, the same material used for the base region 36. Accordingly, also in this embodiment, the two-dimensional positive hole gas layer is formed at the junction interface between the positive hole extraction region 54 and each of these (the electric field alleviating layer 52 and the contact region 38) by adjusting the impurity concentration of the electric field alleviating layer 52, that of the contact region 38, and the like. Because the gas layers have the substantially same configuration as the two-dimensional positive hole gas layer 55 that is formed at the junction interface between the base region 36 and the positive hole extraction region 54, each of these gas layers is also referred to as the two-dimensional positive hole gas layer 55. In other words, the two-dimensional positive hole gas layer 55 is formed on the positive hole extraction region 54 side in a lower surface and a side surface of the positive hole extraction region 54 so as to extend to the upper surface of the semiconductor substrate 11.

In the semiconductor device 10a of the second embodiment, a material (Si) having the smaller band gap than the material (SiC) used for the semiconductor substrate is used. Accordingly, the two-dimensional positive hole gas layer 55 is formed on the positive hole extraction region 54 side in a boundary with the positive hole extraction region 54. Also in this case, when the avalanche breakdown occurs in the semiconductor device 10a, the produced positive hole travels through the two-dimensional positive hole gas layer 55 and is rapidly discharged to the source electrode 46. Thus, it is possible to suppress the overcurrent from flowing through the semiconductor device 10a. That is, the band gap of the material for forming the positive hole extraction region may be either larger or smaller than the band gap of the material used for the semiconductor substrate. The material for forming the positive hole extraction region is not limited to those raised in the above-described embodiments as long as a region in which the valence band exceeds the Fermi level is formed at the junction interface between the base region 36 and the positive hole extraction region by adjusting the band gap or the impurity concentration of the base region 36 and the positive hole extraction region.

Next, a third embodiment will be described with reference to FIG. 5. A description will hereinafter be made only on different points from the first embodiment, and a detailed description on the same configuration as that of the first embodiment will not be repeated.

A semiconductor device 10b of the third embodiment differs from the semiconductor device 10 of the first embodiment in following two points. Specifically, in the semiconductor device 10b of this embodiment, a positive hole extraction region 56 is formed of the same material (SiC) as the semiconductor substrate 11. In addition, the impurity concentration of the positive hole extraction region 56 is set to be higher than the impurity concentration of the base region 36. In other words, the positive hole extraction region 56 has the smaller resistance than the base region 36. In this case, the positive hole that is produced in the boundary of the electric field alleviating layer 52 due to the occurrence of the avalanche breakdown preferentially flows into the positive hole extraction region 56 having the smaller resistance than the base region 36, travels through the positive hole extraction region 56, and is discharged to the source electrode 46. Accordingly, the positive hole is less likely to flow into the base region 36, and consequently, it is possible to suppress the overcurrent from flowing through the semiconductor device 10b. As described above, when the impurity concentration of the positive hole extraction region 56 is set to be higher than that of the base region 36, the positive hole that is produced in the electric field alleviating layer 52 at the avalanche breakdown can efficiently be extracted and discharged to the source electrode 46. Although the positive hole extraction region 56 is formed of the same material as that used for the semiconductor substrate 11 in this embodiment, the positive hole extraction region 56 may be formed of a different material from that used for the semiconductor substrate 11 as long as the transfer resistance in the positive hole extraction region 56 is smaller than that in the base region 36.

Modified Example 1

Next, a modified example 1 of the third embodiment will be described with reference to FIG. 6. A description will hereinafter be made only on different points from the third embodiment, and thus the description on the same configuration as that in the third embodiment will not be repeated.

A semiconductor device 10c of the modified example 1 differs from the semiconductor device 10b of the third embodiment in a point that a positive hole extraction region 58 is not formed to reach the upper surface of the semiconductor substrate 11 but is formed to contact the lower surface of the contact region 38. In general, the impurity concentration of the contact region 38 is set to be higher than the impurity concentration of the base region 36. In other words, the contact region 38 has the smaller resistance than the base region 36. Accordingly, the positive hole that is produced in the boundary of the electric field alleviating layer 52 due to the occurrence of the avalanche breakdown flows into the positive hole extraction region 58 as in the third embodiment, travels through the positive hole extraction region 58, and flows into the contact region 38 that contacts the positive hole extraction region 58. Because the contact region 38 has the small resistance, the positive hole is immediately discharged from the contact region 38 to the source electrode 46. It is also possible with this configuration to suppress the positive hole, which is produced in the electric field alleviating layer 52 by the avalanche breakdown, from flowing into the base region 36 and is thus possible to efficiently discharge the positive hole into the source electrode 46.

A detailed description has been made so far on the embodiments of the technique disclosed in this specification. However, they are merely illustrative, and various modifications and changes made to the above embodiments are included in the semiconductor device disclosed in this specification.

For example, it is configured in the first embodiment that the impurity concentration of the positive hole extraction region 50 is set to be lower than that of the base region 36; however, the positive hole extraction region 50 may have the same impurity concentration as the base region 36. In addition, the positive hole extraction region is formed to the position that is deeper than the base region 36 in the above embodiments; however, the depth of the positive hole extraction region may be same as the base region 36 or shallower than the base region 36 as long as the positive hole extraction region contacts the electric field alleviating layer 52. Also with this configuration, the positive hole that is produced in the electric field alleviating layer 52 due to the occurrence of the avalanche breakdown preferentially flows into the positive hole extraction region (including the two-dimensional positive hole gas layer) having the smaller transfer resistance than the base region 36. Thus, the positive hole can efficiently be discharged. The electric field alleviating layer 52 may have the same depth as the gate trench 24. Also with this configuration, when the high reverse bias voltage is applied to the semiconductor device, an effect can be obtained that the electric field applied to the gate oxide film is alleviated by the electric field alleviating layer 52. In the above embodiments, the positive hole extraction region is formed to reach the upper surface of the semiconductor substrate while penetrating the contact region 38. However, the positive hole extraction region may neither be formed to penetrate the contact region 38 nor contact the contact region 38 as long as it is formed to contact the upper surface of the semiconductor substrate. Here, the upper surface of the semiconductor substrate is not limited to a flat surface. For example, when a groove is formed in the upper surface of the semiconductor substrate, a side surface and a bottom surface thereof are also included in the "upper surface of the semiconductor substrate". Thus, for example, in a configuration that the source electrode is formed in the groove and that the positive hole extraction region is formed to contact the bottom surface of the groove, it can also be said that "the positive hole extraction region contacts the upper surface of the semiconductor substrate". In the above embodiments, the two-dimensional positive hole gas layer is formed not only at the junction interface between the base region 36 and the positive hole extraction region but also at the junction interface between the electric field alleviating layer 52 and the positive hole extraction region as well as at the junction interface between the contact region 38 and the positive hole extraction region. However, the two-dimensional positive hole gas layer may only be formed at the junction interface between the base region 36 and the positive hole extraction region as long as the two-dimensional positive hole gas layer contacts the electric field alleviating layer 52. An element structure that is formed in the element region is not limited to MOS but may be a switching element such as IGBT. In addition, conductive types are not limited to those described in the above embodiments. More specifically, the "n-type" may correspond to the "first conductive type" while the "p-type" corresponds to the "second conductive type".

The concrete examples of the present invention have been described so far in detail. However, they are merely illustrative and do not limit the claims. The techniques disclosed in the claims include various modifications and changes that are made to the above illustrative embodiments. The technical elements that are described in this specification and the drawings demonstrate technical utility when used singly or in various combinations, and thus are not limited to the combinations described in the claims in the original application. The techniques that are illustrated in this specification and the drawings achieve a plurality of objects simultaneously, and the achievement of one object thereof itself has technical usefulness.

What is claimed is:

1. A semiconductor device comprising:
a first semiconductor region that is of a first conductive type and is disposed in an area facing an upper surface of a semiconductor substrate;
a second semiconductor region that is of a second conductive type and is disposed in an area facing the upper surface of the semiconductor substrate;
a base region that is of the first conductive type and contacts a lower surface of the first semiconductor region and a lower surface of the second semiconductor region;
a drift region that is of the second conductive type, contacts a lower surface of the base region, and is separated from the first semiconductor region and the second semiconductor region by the base region;
a gate electrode that is disposed in a gate trench penetrating the base region to extend to the drift region and faces the base region in an area by which the second semiconductor region is separated from the drift region;
an insulator that is disposed between the gate electrode and an inner wall of the gate trench;
an electric field alleviating layer that is of the first conductive type, the electric field alleviating layer of the first conductive type having same impurity concentration as the base region of the first conductive type or higher, the electric field alleviating layer contacting the lower surface of the base region, and the electric field alleviating layer being formed at a same depth as the gate trench or in a position deeper than the gate trench; and
a carrier extraction region that is of the first conductive type, extends to contact the electric field alleviating layer from a position contacting the upper surface of the semiconductor substrate or the first semiconductor region, and extracts a carrier produced in the electric field alleviating layer at avalanche breakdown to the upper surface of the semiconductor substrate.

2. The semiconductor device according to claim 1, wherein the carrier extraction region is formed of a material having a different band gap as a material used for the base region, and
a two-dimensional carrier gas layer, in which transfer resistance of the carrier is smaller than the transfer resistance of the carrier in the base region, is formed at a junction interface between the carrier extraction region and the base region.

3. The semiconductor device according to claim 1, wherein the impurity concentration of the carrier extraction region of the first conductive type is higher than the impurity concentration of the base region of the first conductive type.

* * * * *